United States Patent
Tsai

(10) Patent No.: US 7,670,876 B2
(45) Date of Patent: Mar. 2, 2010

(54) INTEGRATED CIRCUIT DEVICE WITH EMBEDDED PASSIVE COMPONENT BY FLIP-CHIP CONNECTION AND METHOD FOR MANUFACTURING THE SAME

(75) Inventor: Mon-Chin Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/153,584

(22) Filed: May 21, 2008

(65) Prior Publication Data

US 2008/0233676 A1  Sep. 25, 2008

Related U.S. Application Data

(62) Division of application No. 10/923,669, filed on Aug. 24, 2004, now Pat. No. 7,391,118.

(30) Foreign Application Priority Data

Aug. 29, 2003  (TW) ............................... 92123944 A

(51) Int. Cl.
  *H01L 21/44* (2006.01)
  *H01L 21/48* (2006.01)
(52) U.S. Cl. ........................ 438/108; 438/109; 438/110; 257/778
(58) Field of Classification Search ................. 438/108, 438/107, 109–110; 257/778, E23.01, E23.079, 257/E23.141, E23.179
See application file for complete search history.

(56) References Cited

U.S. PATENT DOCUMENTS

| 4,782,381 | A | * | 11/1988 | Ruby et al. ................. 257/724 |
| 5,798,567 | A | * | 8/1998 | Kelly et al. ................. 257/723 |
| 5,973,391 | A | | 10/1999 | Bischoff et al. |
| 6,952,049 | B1 | | 10/2005 | Ogawa et al. |
| 7,298,030 | B2 | * | 11/2007 | McWilliams et al. ........ 257/680 |
| 2005/0046039 | A1 | * | 3/2005 | Yang et al. .................. 257/778 |

FOREIGN PATENT DOCUMENTS

| TW | 457653 | 10/2001 |
| TW | 517275 | 1/2003 |

* cited by examiner

*Primary Examiner*—Theresa T Doan
(74) *Attorney, Agent, or Firm*—Muncy, Geissler, Olds & Lowe, PLLC

(57) ABSTRACT

An integrated circuit device with embedded passive component by flip-chip connection is provided which includes a flip chip and a dummy chip. The dummy chip includes at least an embedded passive component, a plurality of redistribution traces and a plurality of flip-chip pads. The flip chip is smaller than the dummy chip and is mounted on a surface of the dummy chip with the flip-chip pads. The embedded passive component is electrically connected to the flip chip via the redistribution traces and the flip-chip pads. A plurality of solder balls are placed at the peripheral region of the surface of the dummy chip.

9 Claims, 3 Drawing Sheets

INTEGRATED CIRCUIT DEVICE WITH EMBEDDED PASSIVE COMPONENT BY FLIP-CHIP CONNECTION AND METHOD FOR MANUFACTURING THE SAME

RELATED APPLICATIONS

This application is a Division of application U.S. Ser. No. 10/923,669, entitled "INTEGRATED CIRCUIT DEVICE WITH EMBEDDED PASSIVE COMPONENT BY FLIP-CHIP CONNECTION AND METHOD FOR MANUFACTURING THE SAME" and filed on Aug. 24, 2004 now U.S. Pat. No. 7,391,118.

FIELD OF THE INVENTION

The present invention relates to an integrated circuit device, more particularly to an integrated circuit device with embedded passive component in a dummy chip.

BACKGROUND OF THE INVENTION

The conventional integrated circuit device generally includes active components such as transistors and diodes in a chip, and passive components such as condensers and resistors, conductive traces in/on a substrate. In SOC (system on chip) technology, all the active components and passive components are intended to be fabricated in high density on the active surface of a chip. However since the operative functions of integrated circuit device become complicated and various, SIP (system in package) solution becomes more practicable than SOC. Since the different material characteristics and manufacturing processes between active components and passive components (ordinarily active components are made by thin film wafer fabrication processes and passive components are made by thick film wafer fabrication processes), it is very difficult to manufacture embedded passive components inside an IC chip. Especially for the IC chip with RF (radio frequency) functions, the Resistance of the embedded passive component in a chip cannot precisely control. The quality and yield of the IC chip is worse due to the embedded passive component inside the IC chip. As disclosed in R.O.C. Taiwan Patent No. 517,275, a passive component is embedded in an IC chip as part of the IC chip. The embedded passive component is formed on a void space of active surface of the IC chip free of bonding pads. Because the passive component is much cheaper than the IC chip and also is made by different wafer fabrication processes, a passive component embedded in IC chip will result in lower yield and higher fabrication cost.

Alternatively, a passive component is embedded in a package substrate as part of the substrate. As disclosed in R.O.C. Taiwan Patent No. 457,652, a BT substrate includes an embedded capacitor inside. In order to shorten the electrical path between an IC chip and an embedded capacitor, the IC chip is connected to the BT substrate by flip-chip connection, especially the IC chip with RF functions. However the BT substrate is made of BT resin which CTE is between $16 \times 10^{-6}$ and $18 \times 10^{-6}(1/K)$, the CTE of the BT substrate does not match with the CTE ($4 \times 10^{-6}(1/K)$) of the IC chip. It is essential to provide an underfilling material between the IC chip and the BT substrate. Normally the embedded capacitor inside the BT substrate is made by a built-up process, that is to say, the embedded capacitor cannot be small in dimension nor formed in fine pitch.

SUMMARY

The main objective of the present invention is to provide an integrated circuit device with embedded passive components by flip-chip connection. The embedded passive component is included in a dummy chip and is electrically connected to a flip chip by flip-chip connection. The dummy chip has a chip-mounting surface and includes a plurality of redistribution traces and a plurality of flip-chip pads. Bumps on the active surface of the flip chip are connected to the flip-chip pads. Accordingly, the embedded passive component in the dummy chip is electrically connected to the flip chip by flip-chip connection. The dummy chip with the embedded passive component and the flip chip with active components can be fabricated by different wafer processes to achieve higher yield and lower fabrication cost.

The secondary objective of the present invention is to provide an integrated circuit device including a flip chip mounted on a dummy chip. The dummy chip includes an embedded component, such as passive components, optical electronic components or MEMS (micro-electro-mechanical system) components, which is made by a wafer fabrication process different from that of the flip chip. The dummy chip also includes a plurality of redistribution traces and a plurality of flip-chip pads. The embedded component is electrically connected to one of the flip-chip pads via one of the redistribution traces so as to be electrically connected to the flip chip with a short electrical path. Accordingly, the embedded component in the dummy chip can be fabricated separately so as to obtain higher yield, lower fabrication cost with minimum electrical interference.

Accordance with the present invention, an integrated circuit device with embedded passive component by flip-chip connection generally comprises a dummy chip and a flip chip. The dummy chip has a chip-mounting surface and includes at least an embedded passive component, a plurality of redistribution traces and a plurality of flip-chip pads on the chip-mounting surface. The embedded passive component is electrically connected to one of the flip-chip pads via one of the redistribution traces. The flip chip has an active surface and a back surface. The flip chip is mounted on the chip-mounting surface of the dummy chip in a manner that a plurality of bumps connect the bonding pads of the flip chip with the flip-chip pads of the dummy chip to electrically connect the embedded passive component to the flip chip. Preferably, the dummy chip includes a plurality of ball pads at the peripheral region of the chip-mounting surface, the ball pads are electrically connected to the corresponding flip-chip pads via the redistribution traces. Solder balls are placed on the ball pads.

DETAILED DESCRIPTION OF THE PRESENT INVENTION

Figure 1:
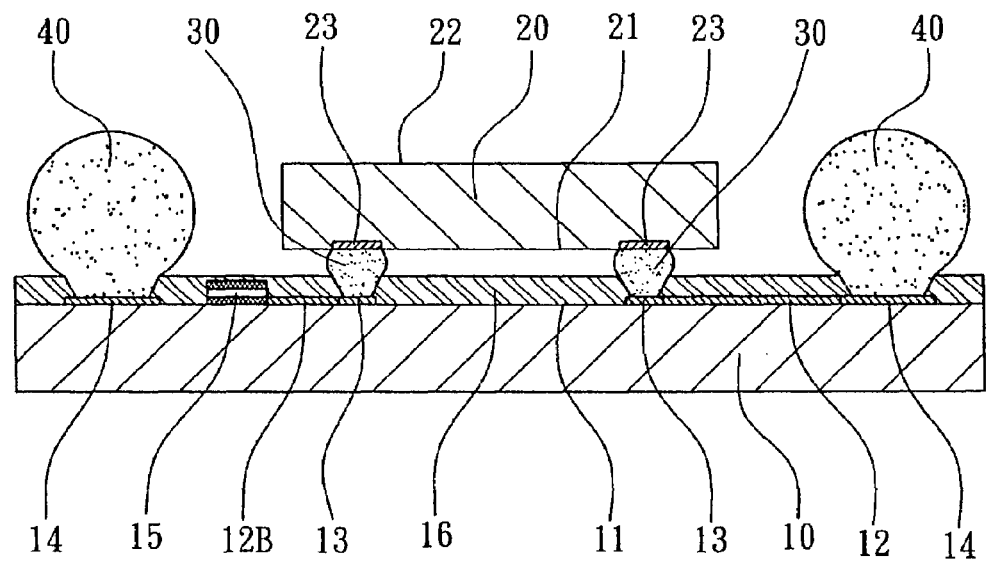
FIG. 1 is a cross-sectional view of an integrated circuit device with embedded passive component by flip-chip connection in accordance with an embodiment of the present invention.

Referring to the drawings attached, the present invention will be described by means of the embodiment below.

Figure 2:
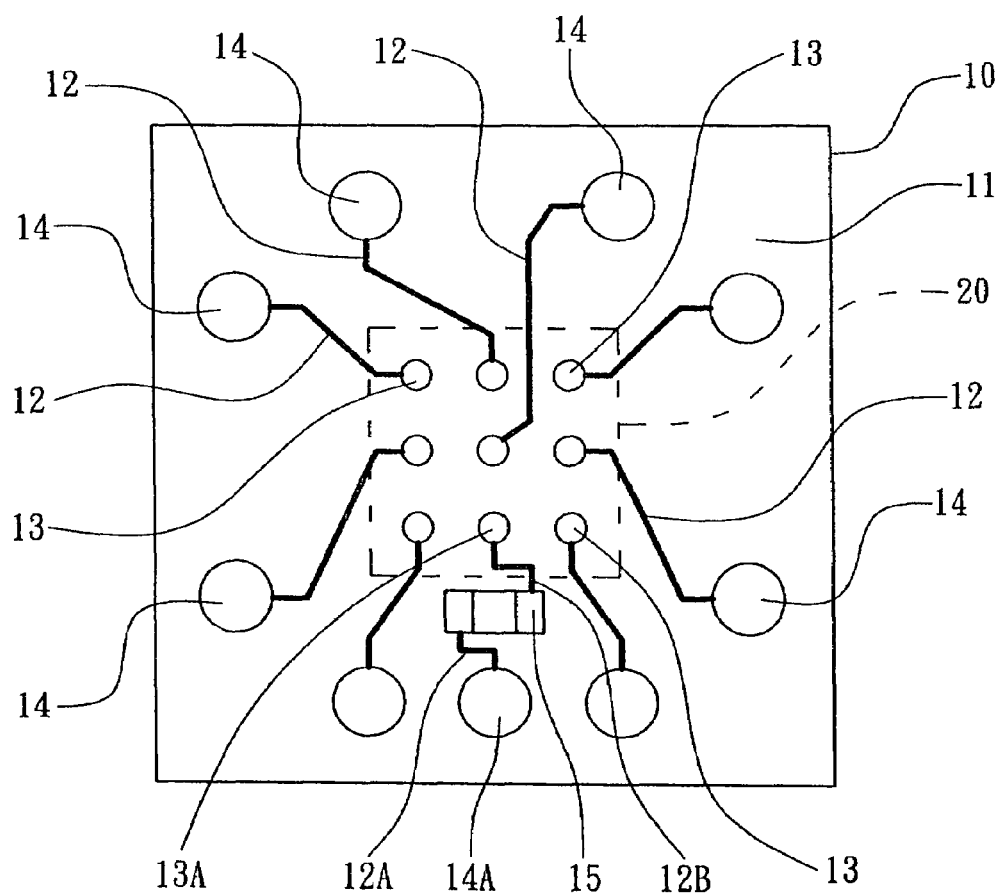
FIG. 2 is a front view of the dummy chip of the integrated circuit device in accordance with the embodiment of the present invention.

Referring to FIG. 1, an integrated circuit device with embedded passive component by flip-chip connection is provided in accordance with the present invention. The integrated circuit device generally comprises a dummy chip 10, a flip chip 20 and a plurality of solder balls 40. Referring to FIG. 1 and FIG. 2, the dummy chip 10 has a chip-mounting surface 11. And the dummy chip 10 includes at least an embedded passive component 15, a plurality of redistribution traces 12, a plurality of flip-chip pads 13 and a plurality of ball pads 14. The dummy chip 10 is a semiconductor substrate made of silicon or gallium arsenide. The chip-mounting surface 11 is larger than the active surface 21 of the flip chip 20. The plurality of redistribution traces 12, the flip-chip pads 13 and the ball pads 14 are formed on the chip-mounting surface 11. One ends of the redistribution traces 12 are connected to the corresponding flip-chip pads 13 and the other ends of the redistribution traces 12 are connected to the corresponding ball pads 14, except the redistribution traces 12B which one end is connected to one electrode of the embedded passive component 15 and the other end to the flip-chip pad 13A. In this embodiment, as shown in FIG. 2, one end of the other redistribution trace 12A is connected to another electrode of the embedded passive component 15 and the other end to the ball pads 14A. The embedded passive component 15 is embedded in the dummy chip 10 with a structure of single layer or multi-layer. The embedded passive component 15 can be selected from the group consisting of capacitor, resistor and inductor, which is fabricated as a part of the dummy chip 10 by a first wafer process, such as a thick film wafer process including printing or sputtering. The material for the embedded passive component 15 has quite different from that of the metal trace and the insulating layer for IC. Preferably, as shown in FIG. 1, a passivation layer 16 is formed on the chip-mounting surface 11 of the dummy chip 10, such as PSG, polyimide or benezocyclobutene (BCB), to cover the redistribution traces 12 and the embedded passive components 15. However the flip-chip pads 13 and the ball pads 14 are exposed out of the passivation layer 16. In this embodiment, as showed in FIG. 2, the chip-mounting surface 11 includes a peripheral region uncovered by the flip chip 20. The ball pads 14 are disposed at the peripheral region of the chip-mounting surface 11, and further electrically connected to the corresponding flip-chip pads 13 via the redistribution traces 12. The ball pads 14 may be circular in shape and have a diameter larger than that of the flip-chip pads 13, moreover, the pitch between the ball pads 14 is larger than the pitch between the flip-chip pads 13.

The flip chip 20 has an active surface 21 and a back surface 22 and is mounted on the chip-mounting surface 11 of the dummy chip 10. On the active surface 21, the flip chip 20 includes a plurality of active components such as metal-oxide-semiconductor field effect transistors (MOSFET) or metal-oxide-semiconductor diodes, a plurality of metal conductive wires (not showed in the drawing) and a plurality of bonding pads 23. The bonding pads 23 are outer terminals of the active components via the metal conductive wires. The active components are fabricated by a second wafer process, such as a thin film wafer fabrication process including photolithography, deposition, and etching technique. A plurality of bumps 30 connect the bonding pads 23 of the flip chip 20 with the flip-chip pads 13 of the dummy chip 10 after flip-chip connection. The embedded passive component 15 in the dummy chip 10 is electrically connected to the flip chip 20 via the redistribution trace 12B to the flip-chip pad 13A and to one of the bumps 30 so as to construct an integrated circuit device with completely electrical function. Preferably, the bumps 30 can be placed on the bonding pads 23 of the flip chip 20 in advance, it is better that under bump metallurgy (UMB) (not showed in the drawings) is formed on the bonding pads 23. Then the bumps 30 are bonded to the flip-chip pads 13 of the dummy chip 10 by a re-flowing treatment.

The solder balls 40 are placed on the ball pads 14, which are much larger than the bumps 30 in dimension. It is better that the solder balls 40 on the ball pads 14 are higher than the back surface 22 of the flip chip 20 (as shown in FIG. 1). The solder balls 40 are used as outer terminals of the dummy chip 10 to electrically connect the flip chip 20 to an external PCB or BT, FR-3, FR-4 substrate etc. One of the solder balls 40 is placed on the ball pad 14A to be electrically connected to the embedded passive component 15 via the redistribution traces 12A as a ground electrode or the other. Therefore, according to the present invention the flip chip 20 is mounted on the dummy chip 10 with embedded passive component 15 to assemble a practicable integrated circuit device. The embedded passive component 15 is formed in the dummy chip 10 and electrically connected to the flip chip 20 via the redistribution trace 12B, the flip-chip pad 13A and one of the bumps 30. In addition to the embedded passive component 15, the other embedded component which is difficult to be fabricated in a flip chip 20, such as MEMS component and optical electronic component, can be formed in the dummy chip 10 and be electrically connected to the flip chip 20 by flip-chip connection to allow the wafer fabrication of the flip chip 20 to obtain a higher yield. Because the coefficient of thermal expansion (CTE) of the dummy chip 10 matches the CTE of the flip chip 20, the embedded passive component 15 can be effectively connected to the flip chip 20. Besides, the dummy chip 10 can be an interposer substrate between the flip chip 20 and a conventional package substrate made of BT, FR-3, FR-4 resin. The risk of cold joint between the flip chip 20 and dummy chip 10 is greatly eliminated because of the CTE match. Moreover, the redistribution trace 12B provides a superior electrically conductive path to connect the embedded passive component 15 and the flip chip 20.

Figure 3A:
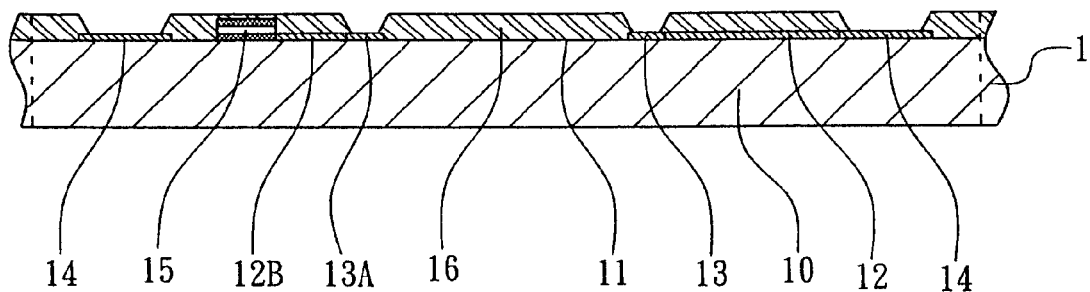
FIG. 3A to FIG. 3D are cross-sectional views of the integrated circuit device during the fabrication process in accordance with the embodiment of the present invention.
Figure 3B:
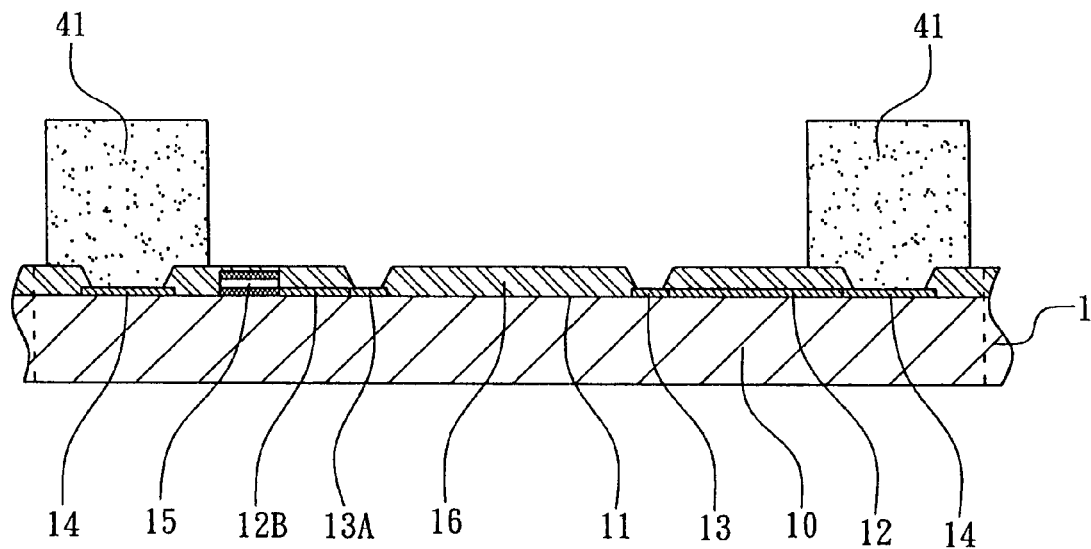
Figure 3C:
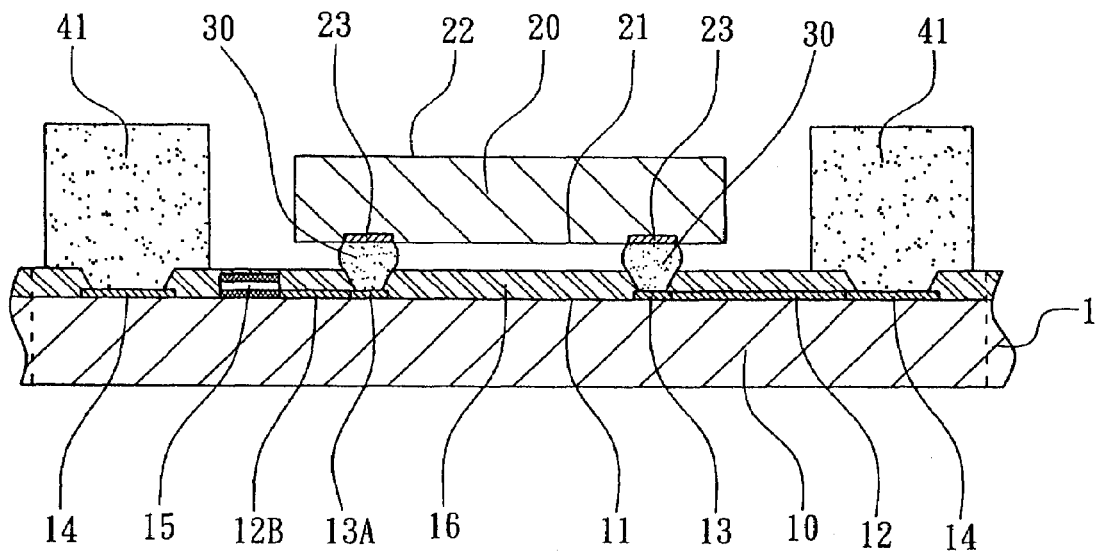
Figure 3D:
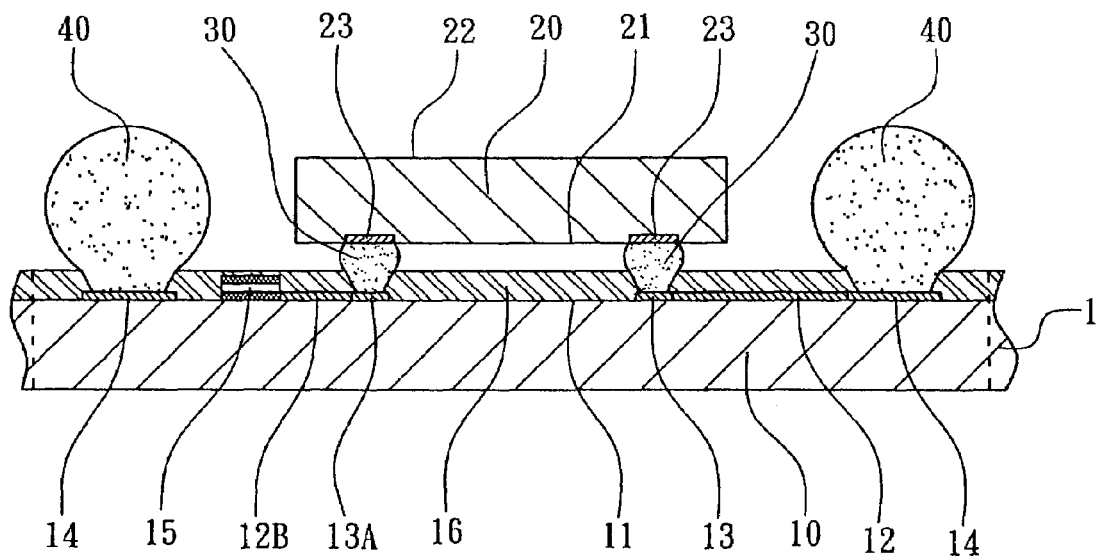

The method for fabrication the foregoing integrated circuit device is also described as follows. Referring to FIG. 3A, a dummy wafer 1 including a plurality of dummy chip is provided initially. In this embodiment, each dummy chip 10 has a chip-mounting surface 11. The embedded component 15 is made by the first wafer fabrication process and is uniformly formed on the dummy wafer 1. The redistribution traces 12, the flip-chip pads 13 and the ball pads 14 are formed on the chip-mounting surfaces 11 of the dummy chips 10. Each embedded passive component 15 is electrically connected to one of the flip-chip pads 13 via one of the redistribution traces 12. Then referring to FIG. 3B, a plurality of solder pastes 41 are formed on the corresponding ball pads 14 on the chip-mounting surfaces 11 of the dummy chips 10 of the dummy wafer 1 by the printing or electroplating technique. Next referring to FIG. 3C, at least a flip chip 20 is mounted on the chip-mounting surfaces 11 of the dummy chips 10 of the dummy wafer 1. The flip chip 20 includes a plurality of bonding pads 23 and a plurality of active component (not shown in figures), the active component is made by the second wafer fabrication process and is electrically connected to the bonding pads 23. Also the flip chip 20 is electrically connected to the flip-chip pads 13 via a plurality of bumps 30. The embedded passive component 15 is electrically connected to the flip chip 20 via the redistribution trace 12A, the flip-chip pad 13A and one of the bumps 30. Finally referring to FIG. 3D, the solder pastes 41 on the dummy wafer 1 are reflowed to form the solder balls 40 on the ball pads 14 and then the wafer 1 is diced to form a plurality of the foregoing integrated circuit devices with embedded passive components by flip-chip connection.

The above description of embodiments of this invention is intended to be illustrated and not limited. Other embodiments of this invention will be obvious to those skilled in the art in view of the above disclosure.

What is claimed is:

1. A method for manufacturing an integrated circuit device comprising the steps of:
   providing at least a dummy chip having a chip-mounting surface, the dummy chip including at least an embedded component, a plurality of redistribution traces formed on the chip-mounting surface and a plurality of flip-chip pads formed on the chip-mounting surface, the embedded component being electrically connected to one of the flip-chip pads via one of the redistribution traces, wherein the dummy chip has a passivation layer formed on the chip-mounting surface and covering the redistribution traces and the embedded component;
   providing at least a flip chip having an active surface, a back surface and a plurality of bonding pads formed on the active surface;
   mounting the flip chip on the chip-mounting surface of the dummy chip via a plurality of bumps, the bumps electrically connecting the bonding pads of the flip chip with the flip-chip pads of the dummy chip.

2. The method in accordance with claim 1, wherein the dummy chip is integrally formed on a dummy wafer.

3. The method in accordance with claim 1, wherein the dummy chip has a plurality of ball pads formed at a peripheral region of the chip-mounting surface, the ball pads are electrically connected to the corresponding flip-chip pads via the redistribution traces.

4. The method in accordance with claim 3, further comprising a step of placing a plurality of solder balls on the ball pads.

5. The method in accordance with claim 4, wherein the solder balls are higher than the back surface of the flip chip.

6. The method in accordance with claim 3, wherein the embedded component is electrically connected to the flip chip.

7. The method in accordance with claim 6, wherein the embedded component is electrically connected to one of the ball pads via one of the redistribution traces.

8. The method in accordance with claim 1, wherein the embedded component is selected from a group consisting of passive component, MEMS component and optical electronic component.

9. The method in accordance with claim 1, wherein the embedded component is selected from a group consisting of capacitor, resistor and inductor.

* * * * *